United States Patent
Mamileti et al.

(10) Patent No.: US 7,447,956 B2
(45) Date of Patent: Nov. 4, 2008

(54) METHOD AND APPARATUS FOR TESTING DATA STEERING LOGIC FOR DATA STORAGE HAVING INDEPENDENTLY ADDRESSABLE SUBUNITS

(75) Inventors: Lakshmikant Mamileti, Cary, NC (US); Anand Krishnamurthy, Morrisville, NC (US); Clint Wayne Mumford, Apex, NC (US); Sanjay B Patel, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 421 days.

(21) Appl. No.: 11/367,959

(22) Filed: Mar. 3, 2006

(65) Prior Publication Data
US 2007/0220378 A1    Sep. 20, 2007

(51) Int. Cl.
G11C 29/00    (2006.01)

(52) U.S. Cl. .............................. 714/718; 714/5; 714/25; 714/30; 714/42; 714/719; 714/723; 714/724; 714/730; 714/733; 714/734; 714/738; 714/742; 714/799

(58) Field of Classification Search ........................ None
See application file for complete search history.

(56) References Cited

U.S. PATENT DOCUMENTS

| | | | | |
|---|---|---|---|---|
| 5,553,082 A | * | 9/1996 | Connor et al. | 714/733 |
| 5,617,531 A | * | 4/1997 | Crouch et al. | 714/30 |
| 5,954,830 A | * | 9/1999 | Ternullo, Jr. | 714/718 |
| 6,111,801 A | * | 8/2000 | Brady | 365/201 |
| 6,182,257 B1 | | 1/2001 | Gillingham | |
| 6,272,588 B1 | | 8/2001 | Johnston et al. | |
| 6,381,715 B1 | * | 4/2002 | Bauman et al. | 714/718 |
| 6,452,848 B1 | * | 9/2002 | Obremski et al. | 365/201 |
| 6,961,276 B2 | * | 11/2005 | Atallah et al. | 365/207 |
| 7,073,100 B2 | * | 7/2006 | Chadwick et al. | 714/718 |
| 2004/0093539 A1 | | 5/2004 | Chadwick et al. | |
| 2005/0204234 A1 | * | 9/2005 | Bacigalupo | 714/733 |
| 2005/0204239 A1 | | 9/2005 | Miyaji | |

* cited by examiner

Primary Examiner—John P Trimmings
(74) Attorney, Agent, or Firm—Nicholas Pauley; John L. Ciccozzi; Thomas R. Rouse

(57) ABSTRACT

Read and write data steering logic in the I/O of a memory array is tested by providing a data bus lane for each addressable subunit of a memory array storage location. Each bus lane is connected to the data input of a comparator. A BIST controller writes test patterns to the memory through the write steering logic and reads the test patterns in parallel to test the write steering logic. The BIST controller writes test patterns to the memory in parallel and reads the test patterns through the read steering logic to test the read steering logic. In both cases, a separate comparator dedicated to each bus lane verifies that the subunit data was properly shifted between the data bus lane and memory storage location subunit. The comparators are effectively disabled during normal operations to prevent logic gate switching.

18 Claims, 4 Drawing Sheets

METHOD AND APPARATUS FOR TESTING DATA STEERING LOGIC FOR DATA STORAGE HAVING INDEPENDENTLY ADDRESSABLE SUBUNITS

FIELD

The present disclosure relates generally to the field of processors and in particular to a method of testing data steering logic in a memory array interface.

BACKGROUND

Microprocessors perform computational operations in a wide variety of applications. A processor may serve as a central or main processing unit in a stationary computing system such as a server or desktop computer. High execution speed is generally desirable for such desktop processors. In addition, processors are increasingly deployed in mobile computers such as laptops and Personal Digital Assistants (PDAs), and in embedded applications such as mobile phones, Global Positioning System (GPS) receivers, portable email clients, and the like. In such mobile applications, in addition to high execution speed, low power consumption and small size are commonly considered to be desirable.

Commonly computer programs are written as if the computer executing them had a very large (ideally, unlimited) amount of fast memory. Common modern processors simulate that ideal condition by employing a hierarchy of memory types, each having different speed and cost characteristics. The memory types in the hierarchy vary from very fast and very expensive at the top, to progressively slower but more economical storage types in lower levels. A common processor memory hierarchy may comprise registers (gates) in the processor at the top level; backed by one or more on-chip caches (SRAM); possibly an off-chip cache (SRAM); main memory (DRAM); disk storage (magnetic media with electro-mechanical access); and tape or CD (magnetic or optical media) at the lowest level. Common portable electronic devices have limited, if any, disk storage, and hence main memory, often limited in size, is the lowest level in the memory hierarchy.

High-speed, on-chip registers comprise the top level of a processor memory hierarchy. Discrete registers and/or latches are used as storage elements in the instruction execution pipeline. Common RISC instruction set architectures include a set of General Purpose Registers (GPRs) for use by the processor to store a wide variety of data, such as instruction op codes, addresses or address offsets, operands for and the intermediate and final results of arithmetic and logical operations, and the like.

In some processors, the logical GPRs directly correspond to physical storage elements. In other processors, register renaming, or dynamically assigning each logical GPR identifier to one of a large set of storage locations, or physical registers is employed. In either case, the storage elements accessed by logical GPR identifiers may be implemented either as discrete registers or as storage locations (or independently addressable subunits of storage locations) within a memory array.

Testing is an important part of IC manufacture. Testing memory arrays is particularly problematic. Automatic Test Pattern Generation (ATPG) methodology commonly used to test random logic comprises scanning an excitation pattern into one set of scan-chained registers or latches, applying the pattern to exercise random logic, capturing the results in another set of scan-chained registers or latches, and scanning the captured results out for comparison to expected values. Memory arrays cannot be efficiently tested using ATPG techniques since data does not flow through memory for subsequent capture and comparison, but rather is stored and retrieved.

Some processors test memory arrays by functional testing, wherein code is executed in the processor pipeline to write test patterns to the array (e.g., to logical GPRs), then read the values and compare to expected values. Functional testing is time consuming and inefficient because the processor must be initialized and test code loaded into the cache prior to executing the tests. Additionally, the control and observation point—within the pipeline—is far removed from the memory locations being tested, and it may be difficult to isolate uncovered faults from intervening circuits.

Accordingly, some processors with embedded memory arrays include a Built-In Self-Test (BIST) circuit that exercises the memory array during a test mode. A conventional BIST controller writes data patterns to the memory array, reads the data patterns, and compares the read data to expected data. In functional mode, the BIST controller is inactive and the memory array is controlled by the processor control circuits. In some BIST systems, I/O circuits surrounding the memory array, such as data steering logic that aligns data written to and read from the array to architecturally-defined bus alignment positions, are not tested.

SUMMARY

In one or more embodiments, read and write data steering logic in the I/O of a memory array is tested by providing a data bus lane for each independently addressable subunit of a memory array storage location. Each bus lane is connected to the data input of a comparator. A BIST controller writes test patterns to the memory through the write steering logic and reads the test patterns in parallel to test the write steering logic. The BIST controller writes test patterns to the memory in parallel and reads the test patterns through the read steering logic to test the read steering logic. In both cases, a separate comparator dedicated to each bus lane verifies that the subunit data was properly shifted between the data bus lane and memory storage location subunit. The comparators are effectively disabled during normal operations to prevent logic gate switching.

One embodiment relates to a method of testing the write data steering logic of an interface interposed between a data bus having N data lanes and a memory array comprising a plurality of storage locations, each comprising N corresponding addressable subunits. For each storage location, a first data pattern is written to at least N-1 subunits. A second data pattern different from the first data pattern is written from one of N bus lanes, through the write data steering logic, to a non-corresponding one of the N subunits. All N subunits are read using all N bus lanes. For each subunit, the data read from the array is compared to the respective first or second data pattern written to that subunit.

Another embodiment relates to a method of testing the read data steering logic of an interface interposed between a memory array comprising a plurality of storage locations, each comprising N addressable subunits, and a data bus having N corresponding data lanes. For each storage location, a test data pattern is written using all N data bus lanes. The test pattern comprises a first data pattern for N-1 subunits other than a subunit under test, and a second data pattern for a subunit under test. N-1 subunits are successively read, through the read steering logic, on a non-corresponding one of the N bus lanes. The subunit data read from the array is compared to the respective first or second data pattern written to that subunit.

Yet another embodiment relates to a processor. The processor includes a memory array comprising a plurality of storage locations, each comprising N addressable subunits, a data bus having N data lanes, and an interface interposed between the data bus and the memory array, the interface including write data steering logic. The processor also includes N comparators each having read data and compare data inputs, the read data input of each comparator connected to one of the N data bus lanes, and outputting an indicator of whether the read data and compare data inputs match. The processor additionally includes a BIST controller controlling the memory array, providing write data to the each of the N data bus lanes, providing compare data to the compare data input of each of the N comparators, and receiving the N comparator match outputs. The BIST controller is operative to write a first data pattern to at least N-1 subunits of a memory array storage location; write a second data pattern different from the first data pattern from one of N bus lanes, through the write data steering logic, to a non-corresponding one of the N subunits of the storage location; read all N subunits of the storage location using all N bus lanes; provide the respective first or second data pattern to each comparator; and inspect the comparator match outputs to verify the write data steering logic operation.

Still another embodiment relates to a processor. The processor includes a memory array comprising a plurality of storage locations, each comprising N addressable subunits, a data bus having N corresponding data lanes, and an interface interposed between the memory array and the data bus, the interface including read data steering logic. The processor also includes N comparators each having read data and compare data inputs, the read data input of each comparator connected to one of the N data bus lanes, and outputting an indicator of whether the read data and compare data inputs match. The processor additionally includes a BIST controller controlling the memory array, providing write data to the each of the N data bus lanes, providing compare data to the compare data input of each of the N comparators, and receiving the N comparator match output. The BIST controller is operative to write to a storage location in the memory array a test data pattern comprising a first data pattern for N-1 subunits other than a subunit under test, and a second data pattern for a subunit under test, using all N data bus lanes; successively read each N-1 subunits of the storage location, through the read data steering logic, on a non-corresponding one of the N bus lanes; provide the respective first or second data pattern to the comparator corresponding to the bus lane to which read data is directed; and inspect that comparator's match output to verify the read data steering logic operation.

DETAILED DESCRIPTION

Figure 1:
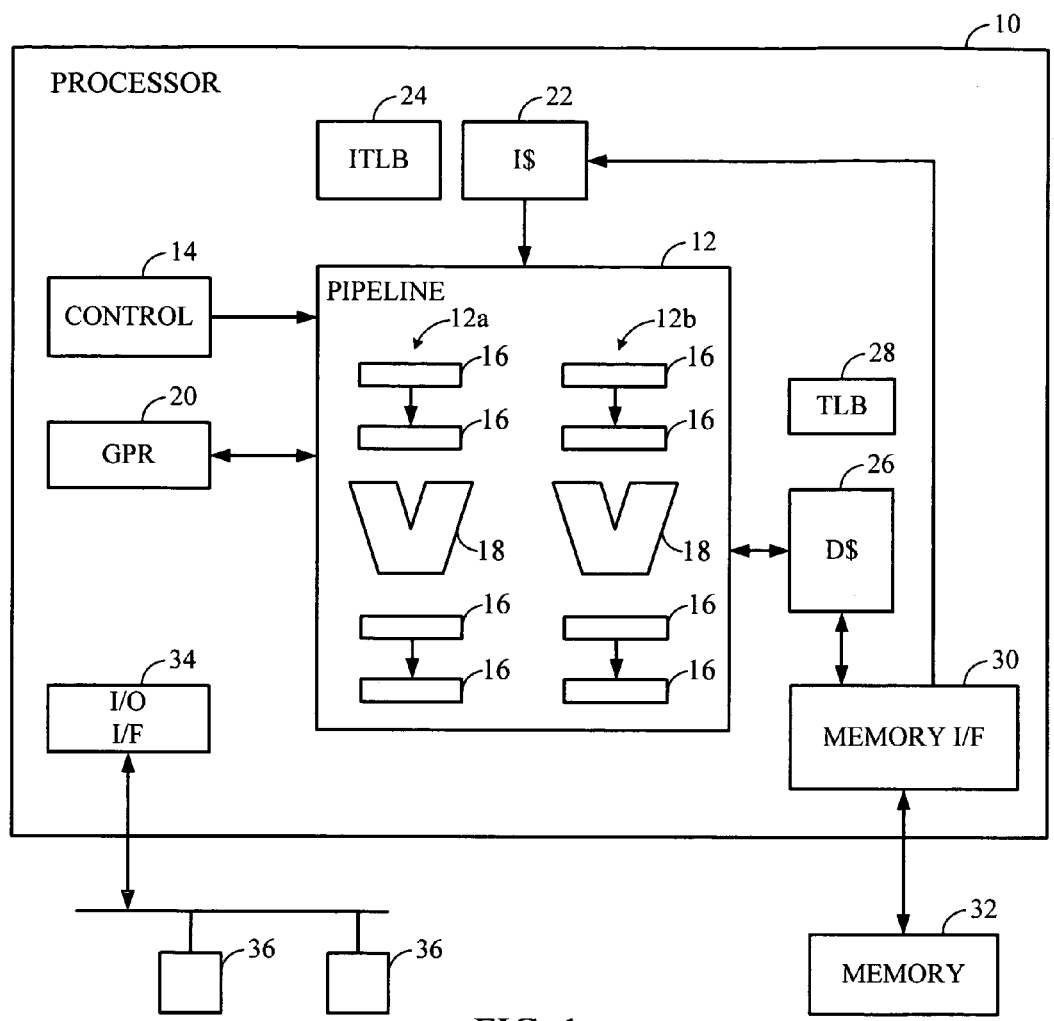
FIG. 1 is a functional block diagram of a processor.

FIG. 1 depicts a functional block diagram of a processor 10. The processor 10 executes instructions in an instruction execution pipeline 12 according to control logic 14. The pipeline 12 may be a superscalar design, with multiple parallel pipelines such as 12a and 12b. The pipelines 12a, 12b include various registers or latches 16, organized in pipeline stages, and one or more Arithmetic Logic Units (ALU) 18. A register or memory array 20 provides a plurality of storage locations that are mapped to logical General Purpose Registers (GPRs).

The pipelines 12a, 12b receive instructions from an Instruction Cache (I-Cache) 22, with memory addressing and permissions managed by an Instruction-side Translation Lookaside Buffer (ITLB) 24. Data is accessed from a Data Cache (D-Cache) 26, with memory addressing and permissions managed by a main Translation Lookaside Buffer (TLB) 28. In various embodiments, the ITLB may comprise a copy of part of the TLB. Alternatively, the ITLB and TLB may be integrated. Similarly, in various embodiments of the processor 10, the I-cache 22 and D-cache 26 may be integrated, or unified. Misses in the I-cache 22 and/or the D-cache 26 cause an access to main (off-chip) memory 32, under the control of a memory interface 30. The processor 10 may include an Input/Output (I/O) interface 34, controlling access to various peripheral devices 36. Those of skill in the art will recognize that numerous variations of the processor 10 are possible. For example, the processor 10 may include a second-level (L2) cache for either or both the I and D caches. In addition, one or more of the functional blocks depicted in the processor 10 may be omitted from a particular embodiment.

Figure 2:
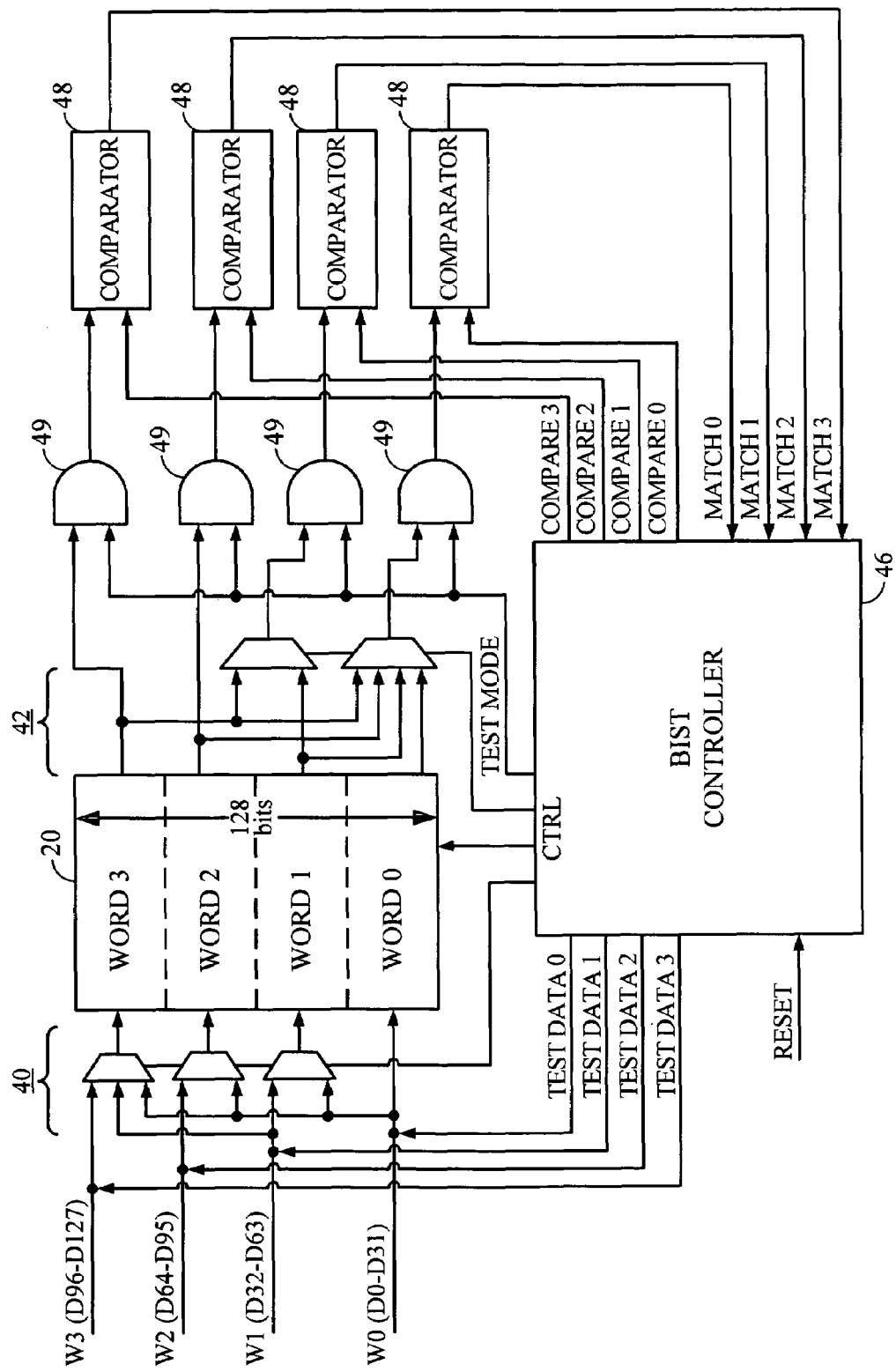
FIG. 2 is a functional block diagram of a memory array with associated data-steering I/O, and a BIST circuit.

FIG. 2 depicts a memory array 20, which may for example implement a set of logical GPRs, and a Built-In Self Test (BIST) controller 46. The memory array 20 is organized as 128 bits by 16, although the test methodology and apparatus disclosed herein is applicable to any configuration of memory having independently addressable subunits. Each 128-bit location in the memory array 20 has a word (32 bit) read/write granularity, and the array 20 is logically and physically segmented at word boundaries.

The memory array 20 includes write data steering logic 40 and read data steering logic 42 to conform to an architectural requirement that data be right-aligned. That is, the architecture defines three data sizes that may be written to or read from the memory array 20: words (32 bits), double-words (64 bits), and quad-words (128 bits). Quad-words occupy the full data bus, or word lanes W0-W3 (bits D0-D127). Double-words are always right-aligned on the data bus, i.e., they occupy word lanes W0 and W1 (bits D0-D63). However, double-words may be stored in a storage location within the memory array 20 in either position W0-W1 (bits D0-D63) or W2-W3 (bits D64-D127). Hence, multiplexers in the write steering logic 40 direct data on bus lane W1 (bits D32-D63) to either position W1 (bits D32-D63) or W3 (bits D96-D127) in the memory array 20. Similarly, a multiplexer in the read steering logic 42 selectively directs data from memory array positions W1 and W3 to bus lane W1. Additionally, words are always right-aligned on the bus (lane W0), but may occupy any of the W0, W1, W2, or W3 positions in a storage location in the memory array 20. Multiplexers in the write steering logic 40 direct bus lane W0 to all memory array 20 word positions, and multiplexers in the read steering logic 42 direct data from any word position in the memory array 20 to bus lane W0. The multiplexers in the write steering logic 40 and read steering logic 42 are under the control of the processor during normal operation, and are controlled by the BIST controller 46 in test mode.

In test mode, the BIST controller 46 additionally provides test data to the data bus for writing to the memory array 20, and provides compare data to the comparators 48. The BIST controller 46 also controls the operation of the memory array 20 and selectors within the write steering logic 40 and read steering logic 42, and outputs a test mode signal to gates 49 to suppress switching in normal operating mode, as described herein. The comparators 48—one per bus lane—each receive a word of data read from the memory array 20 at a data input, and a compare data pattern from the BIST controller 46 at a compare input. The output of each comparator 48 indicates whether the read data at the data input matches the compare pattern provided by the BIST controller 46. This match output of each comparator 48 is routed to the BIST controller 46.

To fully test the memory array 20, the write steering logic 40, and the read steering logic 42, the number of comparators must match the granularity of read/write addressability per storage location in the memory array 20. For example, if the memory array 20 were byte-addressable, sixteen comparators 48 would be required to test the array and associated byte-steering logic (8×16=128). In general, each memory array 20 storage location has N subunits, or independently addressable portions, and the data bus comprises N corresponding data lanes. Fully testing the write data steering logic 40 and read data steering logic 42 requires N comparators. In FIG. 2, N=4, and each subunit is a word.

In an initial test, the BIST controller 46 may verify the memory array 20 by writing test data patterns to, and reading data from, the memory array 20 using the entire 128-bit data bus (i.e., all four bus lanes). In particular, following standard memory test procedures, the BIST controller 46 initially writes a background pattern to every storage location in the memory array 20. The BIST controller 46 then writes—using all four data bus lanes—test patterns to the memory array 20 storage locations. Data is then read from each memory array 20 storage location—again, using all four data bus lanes—and routed directly to the data input of each comparator 48 (that is, neither the write data steering logic 40 nor the read data steering logic 42 shifts any data from one word position to another).

Compare data corresponding to the written test pattern is supplied by the BIST controller 46 to the compare input of each comparator 48. Each comparator 48 compares the data at its inputs and provides an indication of whether the data patterns match to the BIST controller 46. A mismatch indicates a memory array 20 defect. The data pattern to used to verify operation of the memory array 20 may comprise static patterns such as a "checkerboard" of alternating one's and zero's; a dynamic pattern of "marching one's" and/or "marching zero's" by iteratively testing each storage location; or other memory test patterns and procedures, as well known in the art.

Figure 3:
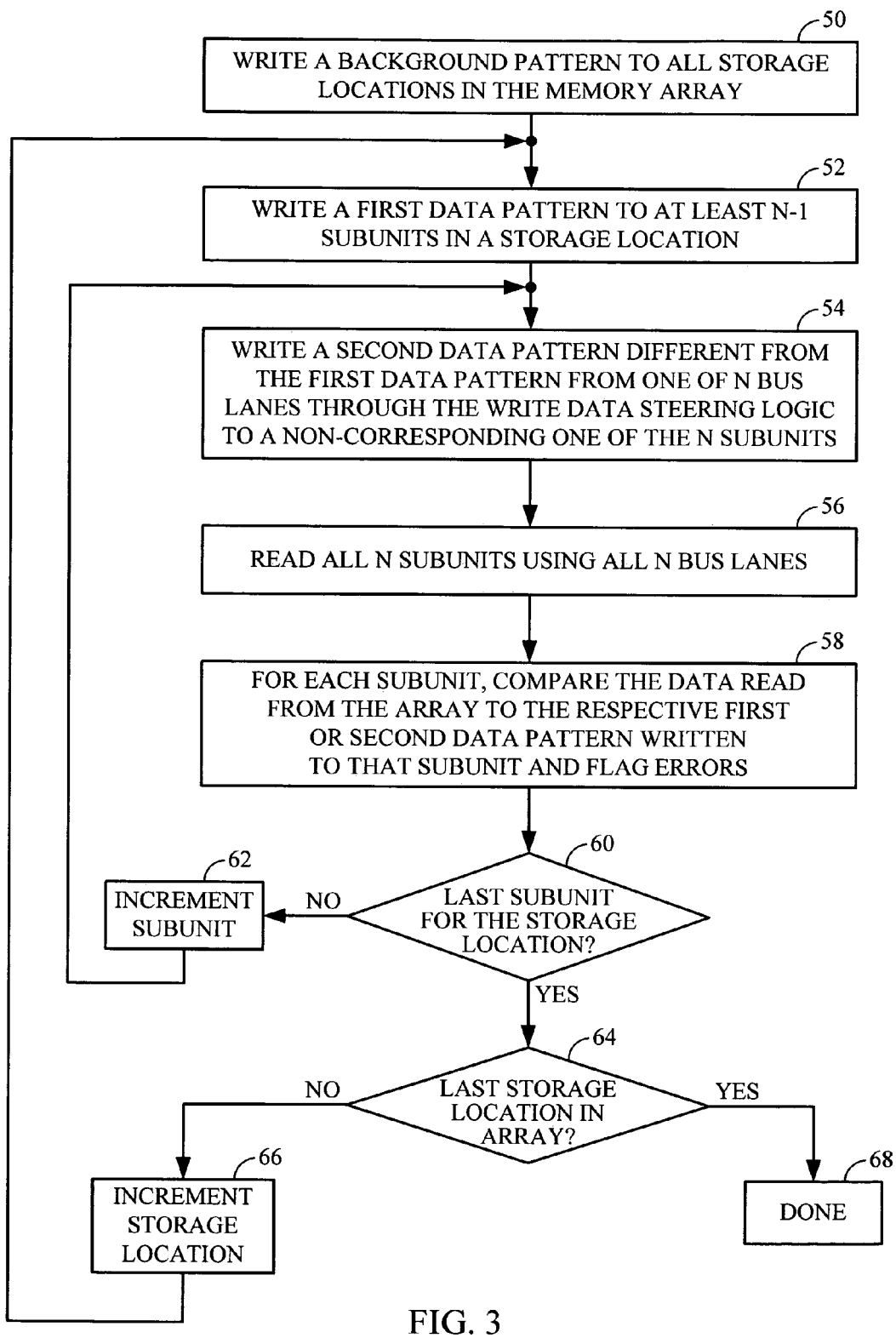
FIG. 3 is a flow diagram of a method of testing write data steering logic.

According to one or more embodiments, the BIST controller 46 may additionally test the functionality of the write data steering logic 40 and/or the read data steering logic 42. A method of testing the write data steering logic 40 is depicted in flow diagram form in FIG. 3. Initially, a background data pattern is optionally written to all storage locations in the memory array 20 (block 50). The BIST controller 46 then writes a first data pattern to at least N-1 subunits in a single storage location (block 52). To minimize test time, the BIST controller 46 may write the first data pattern to all subunits in a storage location utilizing all N lanes of the data bus. The first data pattern may comprise, for example all one's or all zero's. The BIST controller 46 then writes a second data pattern, different from the first data pattern, from one of the N bus lanes, through the write data steering logic, to a non-corresponding one of the N subunits of the memory array 20 storage location (block 54). For example, the BIST controller 46 may place a second data pattern on bus lane W0, and write the second pattern through the write data steering logic to subunit position W1, W2, or W3 of a storage location in the memory array 20. The second data pattern may, for example, comprise a "checkerboard" pattern such as 0101 or 1010.

The BIST controller 46 then reads all N subunits of the storage location in parallel, using all N lanes of the data bus (block 56). As depicted in FIG. 2, each data bus lane is directed to the data input of a corresponding comparator 48. The BIST controller 46 provides a compare data pattern to the compare input of each comparator 48. The compare data patterns comprise the first data pattern for N-1 comparators 48, and the second data pattern for the comparator 48 corresponding to the storage location subunit to which the second data pattern was directed by the write data steering logic 40. The comparators a 48 compare the data read from the memory array 20 to the compare inputs provided by the BIST controller 46 and provide an output to the BIST controller 46 indicative of whether the data patterns match. The BIST controller 46 inspects the match outputs, and flags any misscompare's as errors (block 58). The test is repeated for every subunit in the storage location (blocks 60, 62), and may be repeated for every storage location in the memory array 20 (blocks 64, 66, 68).

The BIST controller may test double-word steering directly by providing second data patterns to the W0 and W1 bus lanes, directing the second data pattern in successive tests to one of W0-W1 or W2-W3 double-word positions in a memory array 20 storage location, reading the entire storage location, and providing the corresponding first or second data pattern to the comparators 48 to verify the operation of the write data steering logic 40 for double-words. In general, the BIST controller may write the second data pattern to M of the N subunits, where M is an integral factor of N, from M of the N bus lanes, through the write steering logic 40, to a non-corresponding M of the N subunit positions, to test the write steering logic 40 for M-size data steering functionality. In the embodiment depicted in FIG. 2, M=2 for a double-word.

Alternatively, the BIST controller 46 may selectively test each leg of any selector in the write data steering logic 40 by providing the second data pattern to one data bus lane, directing the second data pattern to a non-corresponding subunit within the memory array 20 storage location, reading all subunits of the storage location in parallel, and verifying the placement of the second data pattern. For example, with reference to FIG. 2, the double-word steering logic that steers data from bus lane W1 to the memory storage location W3 may be tested by placing the second data pattern on the W1 bus lane, writing the second pattern while providing the appropriate control signals to the write data steering logic 40 selectors, reading the full storage location, and providing the second data pattern as a compare input to the comparator 48 associated with the W3 bus lane. In this example, the write data steering logic 40 path directing the W0 bus lane to the W2 subunit of the storage location was tested in the previous test. Thus, in general, the BIST controller 46 may thoroughly test the write data steering logic 40 by directing a single subunit of second pattern data from a bus lane to a non-corresponding subunit position within a storage location, with appropriate control of the write data steering logic 40 selectors, and verifying the data upon reading the full storage location.

Figure 4:
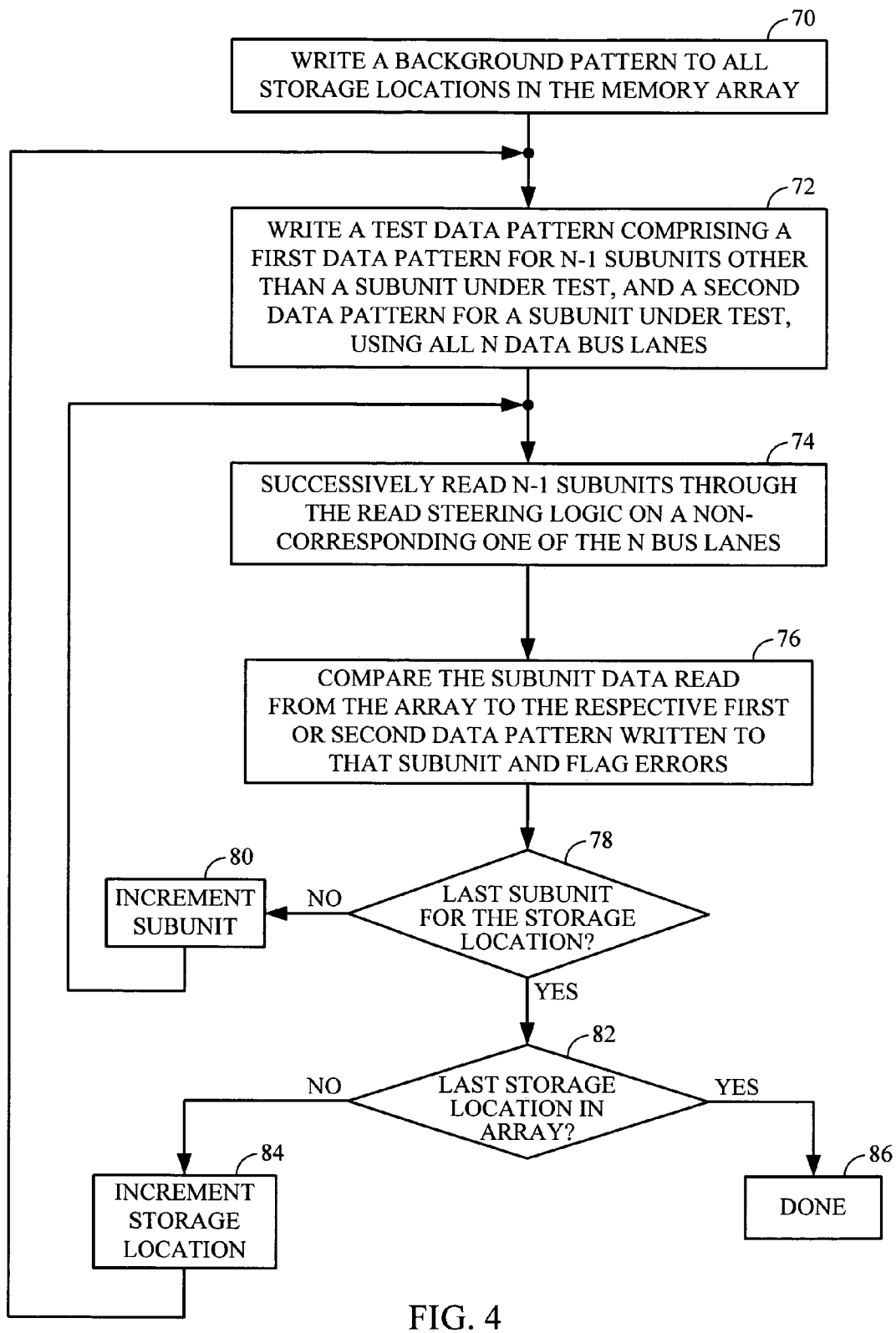
FIG. 4 is a flow diagram of a method of testing read data steering logic.

A method of testing the read data steering logic 42 is depicted in flow diagram form in FIG. 4. Initially, a background data pattern is optionally written to all storage locations in the memory array 20 (block 70). The BIST controller 46 writes a test data pattern to a storage location in the memory array 20, using all N bus lanes (block 72). The test pattern comprises a first data pattern in the positions of N-1 subunits other than a subunit under test, and a second data pattern different then the first data pattern in the position of a subunit under test. Data is then successively read from N-1 subunits in the storage location, through the read steering logic, onto a non-corresponding bus lane (block 74), and to the data input of the associated comparator 48. The BIST controller 46 provides the first or second data pattern to the compare input of the comparator 48, and verifies a match by inspecting the comparator 48 output (block 76). The BIST controller 46 repeats the test N-1 times, placing the second data pattern in a different subunit position in the memory array 20 storage location (block 78, 80). The test may be repeated for each storage location in the memory array 20 (blocks 82, 84, 86).

The read data steering logic 42 may be tested for double-words by writing the second data pattern alternately to the W0-W1 subunit positions and the W2-W3 subunit positions of a storage location, reading the double-words on the W0-W1 data bus lanes through the read data steering logic 42, and comparing the data read in the two comparators 48 corresponding to the W0-W1 data bus lanes. Alternatively, double-word read data steering logic 42 may be tested by writing a test data pattern comprising the second data pattern only in the W3 subunit position, and the first data pattern elsewhere. The W3 subunit may be read from the array and directed to the W1 data bus lane by controlling the read data steering logic 42 selector control signals. The second data pattern is provided as a compare input to the comparator 48 associated with the bus lane W1, and the steering of the second data pattern verified. In general, all paths in the read data steering logic 42 may be tested by writing the second data pattern to a single subunit of a storage location, and controlling the read data steering logic 42 selectors to direct the second data pattern to a non-corresponding data bus lane.

Referring again to FIG. 2, the comparator circuits 48 comprise a static logic gates. That is, the comparators 48 will compare any data pattern presented at their data input to the data present at their compare input, and will generate a signal indicative of whether the data patterns match. During normal processor operation (i.e., not in test mode), the data output by the memory array 20 (and the read data steering logic 42) will constantly change. Since the compare data inputs cannot be matched to data being read from the memory array 20, gates within the comparators 48 will be constantly switching, the consuming power, generating heat, and contributing to electrical noise on the power and ground rails.

Accordingly, the comparator circuits 48 are effectively disabled during normal operations by ensuring that a static data pattern is presented at the comparators 48 data inputs. In one embodiment, the data from the corresponding data bus lane is gated, such as by AND gate 49, with a TEST MODE signal from the BIST controller 46. The AND gate 49 AND's the test mode signal with each bit of the data lane (i.e., 32 bits as depicted in FIG. 2).

Upon system reset (or in response to any other indicator that the processor is in normal operating mode), the BIST controller 40 deasserts the TEST MODE signal, and the AND gates 49 present a static data pattern of zero's to the comparators 48. The BIST controller 40 may optionally present a corresponding static data pattern (e.g., zero's) to the compare input of the comparators 48. Whether the comparators 48 output indicate a data match or a miscompare, since the inputs are static, gates within the comparators 48 will not switch beyond the initial one-cycle comparison. In this manner, the power consumption and switching noise associated with random gate switching within the comparators 48 is suppressed in normal operating mode.

Although the present disclosure has been described herein with reference to a memory array, the disclosure of the present disclosure may be applied to any data storage location or array of storage locations having addressable subunits and write and/or read data steering logic, such as register files, memory arrays, or the like. In general, although the present disclosure has been described herein with respect to particular features, aspects and embodiments thereof, it will be apparent that numerous variations, modifications, and other embodiments are possible within the broad scope of the present disclosure, and accordingly, all variations, modifications and embodiments are to be regarded as being within the scope of the disclosure. The present embodiments are therefore to be construed in all aspects as illustrative and not restrictive and all changes coming within the meaning and equivalency range of the appended claims are intended to be embraced therein.

What is claimed is:

1. A method of testing write data steering logic of an interface interposed between a data bus having N data lanes and a memory array comprising a plurality of storage locations, each comprising N corresponding addressable subunits, comprising, for each storage location:
    writing a first data pattern to at least N-1 subunits;
    writing a second data pattern different from the first data pattern from one of N data bus lanes, through the write data steering logic, to a non-corresponding one of the N subunits;
    reading all N subunits using all N data bus lanes; and
    for each subunit, comparing the data read from the array to the respective first or second data pattern written to that subunit.

2. The method of claim 1 wherein writing a first data pattern to at least N-1 subunits comprises first writing a background pattern to all N subunits using all N data bus lanes.

3. The method of claim 1 further comprising repeating the test N-1 times for each storage location, writing the second data pattern to a different subunit of the storage location each time.

4. The method of claim 3 further comprising repeating the tests for each storage location in the memory array.

5. The method of claim 1 wherein comparing the data read from the array to the respective first or second data pattern written to that subunit comprises independently comparing the data read from each subunit to the first or second data pattern written to that subunit, in parallel.

6. The method of claim 5 wherein comparing the data in parallel comprises, for each subunit, directing the data read from the array and the respective first or second data pattern to one of N comparators.

7. The method of claim 1, further comprising, after writing the first data pattern:
    writing a second data pattern different from the first data pattern to M of the N subunits, where M is an integral factor of N, from the first M bus lanes through the write steering logic.

8. The method of claim 7 further comprising repeating the test N/M times for each storage location, writing the second data pattern from the first M bus lanes, through the write data steering logic, to a different M of the N subunits of the storage location each time.

9. The method of claim 1 further comprising, in a non-test mode, directing a fixed input to comparator circuits performing data comparisons in a test mode, to prevent the comparator circuits from switching in response to memory array data reads in the non-test mode.

10. A method of testing read data steering logic of an interface interposed between a memory array comprising a plurality of storage locations, each comprising N addressable subunits, and a data bus having N corresponding data lanes, comprising, for each storage location:
- writing a test data pattern comprising a first data pattern for N-1 subunits other than a subunit under test, and a second data pattern for a subunit under test, using all N data bus lanes;
- successively reading N-1 subunits, through the read steering logic, on a non-corresponding one of the N data bus lanes; and
- comparing the subunit data read from the array to the respective first or second data pattern written to that subunit.

11. The method of claim 10 further comprising repeating the test N-1 times for each storage location, writing the second data pattern to a different subunit each time.

12. The method of claim 11 further comprising repeating the tests for each storage location in the memory array.

13. The method of claim 10 further comprising, in a non-test mode, directing a fixed input to comparator circuits performing data comparisons in a test mode, to prevent the comparator circuits from switching in response to memory array data reads in the non-test mode.

14. A processor, comprising:
- a memory array comprising a plurality of storage locations, each comprising N addressable subunits;
- a data bus having N data lanes;
- an interface interposed between the data bus and the memory array, the interface including write data steering logic;
- N comparators each having read data and compare data inputs, the read data input of each comparator connected to one of the N data bus lanes, and outputting an indicator of whether the read data and compare data inputs match;
- a Built-In Self-Test (BIST) controller controlling the memory array, providing write data to the each of the N data bus lanes, providing compare data to the compare data input of each of the N comparators, and receiving the N comparator match outputs, the BIST controller operative to:
  - write a first data pattern to at least N-1 subunits of the memory array storage location;
  - write a second data pattern different from the first data pattern from one of N data bus lanes, through the write data steering logic, to a non-corresponding one of the N subunits of the storage location;
  - read all N subunits of the storage location using all N bus lanes;
  - provide the respective first or second data pattern to each comparator; and
  - inspect the comparator match outputs to verify the write data steering logic operation.

15. A processor, comprising:
- a memory array comprising a plurality of storage locations, each comprising N addressable subunits;
- a data bus having N corresponding data lanes;
- an interface interposed between the memory array and the data bus, the interface including read data steering logic;
- N comparators each having read data and compare data inputs, the read data input of each comparator connected to one of the N data bus lanes, and outputting an indicator of whether the read data and compare data inputs match;
- a Built-In Self-Test (BIST) controller controlling the memory array, providing write data to the each of the N data bus lanes, providing compare data to the compare data input of each of the N comparators, and receiving the N comparator match output, the BIST controller operative to:
  - write to a storage location in the memory array a test data pattern comprising a first data pattern for N-1 subunits other than a subunit under test, and a second data pattern for a subunit under test, using all N data bus lanes;
  - successively read each N-1 subunits of the storage location, through the read data steering logic, on a non-corresponding one of the N bus lanes;
  - provide the respective first or second data pattern to the comparator corresponding to the bus lane to which read data is directed; and
  - inspect that comparator's match output to verify the read data steering logic operation.

16. The processor of claim 15, further comprising logic interposed between the memory array and the data bus operative to present a static data pattern to the data input of each comparator in a non-test mode.

17. The processor of claim 16 wherein the logic comprises a selector in the read data steering logic having an input tied to a static data pattern.

18. The processor of claim 16 wherein the logic implements an AND function between read data bits and a test mode signal.

* * * * *